United States Patent [19]

Koh

[11] Patent Number: 5,475,224
[45] Date of Patent: Dec. 12, 1995

[54] INFRARED DETECTOR SUBSTRATE WITH BREAKAWAY TEST TABS

[75] Inventor: Wei H. Koh, Irvine, Calif.

[73] Assignee: Grumman Aerospace Corporation, Bethpage, N.Y.

[21] Appl. No.: 296,817

[22] Filed: Aug. 26, 1994

[51] Int. Cl.$^6$ .................................................. H01L 27/14
[52] U.S. Cl. ........................ 250/349; 250/339.02; 257/48
[58] Field of Search ........................... 250/349, 338.4, 250/339.02, 339.12, 342, 332; 257/797, 48, 466, 620

[56] References Cited

U.S. PATENT DOCUMENTS

| | | | |
|---|---|---|---|
| 4,784,970 | 11/1988 | Solomon | 437/51 |
| 4,794,092 | 12/1988 | Solomon | 437/51 |
| 4,907,128 | 3/1990 | Solomon et al. | 361/412 |
| 4,988,641 | 1/1991 | Solomon | 437/83 |
| 4,992,908 | 2/1991 | Solomon | 361/400 |
| 5,001,544 | 3/1991 | Boucard | 257/48 |
| 5,013,687 | 5/1991 | Solomon | 437/209 |
| 5,013,919 | 5/1991 | Solomon | 250/349 |
| 5,030,828 | 7/1991 | Solomon | 250/338.4 |
| 5,036,203 | 7/1991 | Solomon | 250/370.06 |
| 5,045,907 | 9/1991 | Solomon | 357/30 |
| 5,053,350 | 10/1991 | Solomon | 437/47 |
| 5,064,771 | 11/1991 | Solomon | 437/3 |
| 5,067,233 | 11/1991 | Solomon | 29/852 |
| 5,075,201 | 12/1991 | Koh | 430/321 |
| 5,075,238 | 12/1991 | Solomon | 437/3 |
| 5,093,708 | 3/1992 | Solomon | 357/68 |
| 5,128,749 | 7/1992 | Hornback et al. | 357/80 |
| 5,135,556 | 8/1992 | Hornback et al. | 65/43 |
| 5,138,164 | 8/1992 | Koh | 250/339 |
| 5,149,671 | 9/1992 | Koh et al. | 437/183 |
| 5,209,798 | 5/1993 | Solomon et al. | 156/153 |
| 5,231,304 | 7/1993 | Solomon | 257/684 |
| 5,315,147 | 5/1994 | Solomon | 257/448 |
| 5,369,277 | 11/1994 | Knodle et al. | 250/343 |

Primary Examiner—Davis L. Willis
Assistant Examiner—Richard Hanig
Attorney, Agent, or Firm—Stetina Brunda & Buyan

[57] ABSTRACT

A substrate for attaching infrared detector elements to multi-layer modules has a detector interface member to which the infrared detector elements are attachable and which is attachable to the multi-layer module so as to provide electrical communication between the infrared detector elements and the multi-layer module. At least one removable tab is formed upon the detector interface member and a plurality of probing pads are formed upon each tab. Conductive conduits formed upon each tab extend from the detector interface member to the probing pads so as to facilitate electrical communication between dedicated ones of the infrared detector elements and dedicated ones of the probing pads. The probing pads facilitate electrical testing of individual infrared detector elements.

26 Claims, 5 Drawing Sheets

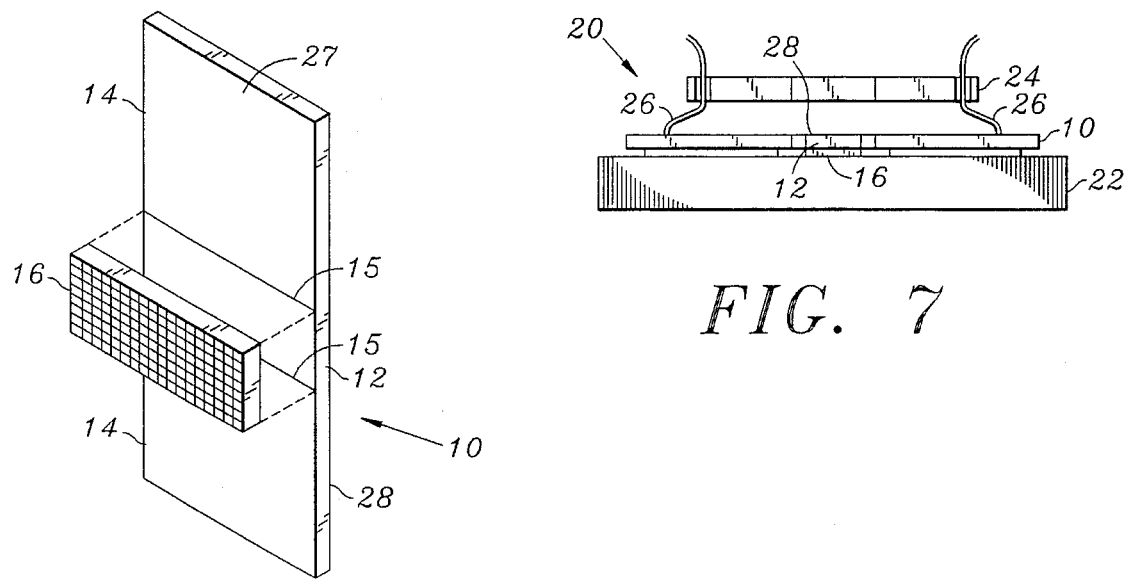
FIG. 6
FIG. 7
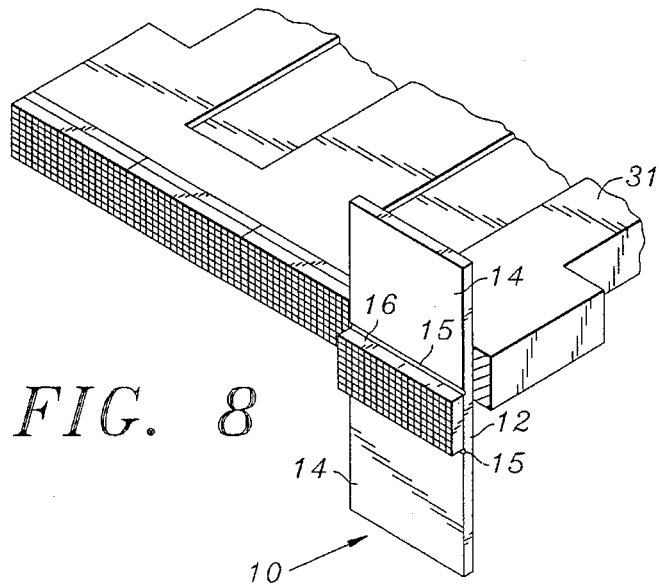
FIG. 8
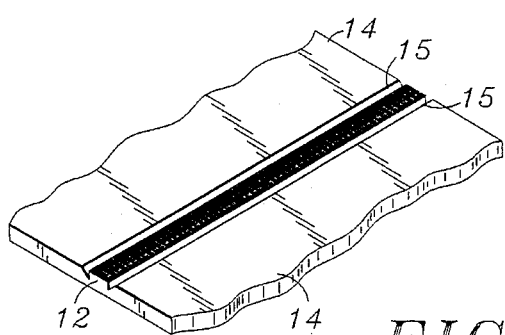
FIG. 9

INFRARED DETECTOR SUBSTRATE WITH BREAKAWAY TEST TABS

FIELD OF THE INVENTION

The present invention relates generally to infrared detectors and more particularly to a substrate for mounting infrared detectors wherein the substrate comprises breakaway test tabs. The breakaway test tabs comprise conductive patterns formed thereon for providing electrical communication between individual infrared detector elements and probing pads formed upon the breakaway test tabs. The breakaway test tabs thus facilitate handling and alignment of the detector elements as well as electrical testing thereof.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects will dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperate in turn causes some other property of the material, such as resistivity, to change. By measuring this change the infrared radiation is measured.

Photo-type detectors (e.g., photoconductive and photovoltaic detectors) absorb the infrared frequency energy directly into the electronic structure of the material, inducing an electronic transition which, in turn, leads to either a change in the electrical conductivity (photoconductors) or to the generation of an output voltage across the terminals of the detector (photovoltaic detectors). The precise change that is effected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, as well as advances in semiconductor materials and highly sensitive electronic circuitry have advanced the performance of contemporary infrared detectors close to the ideal photon limit.

Current infrared detection systems incorporate arrays of large numbers of discrete, highly sensitive detector elements, the outputs of which are connected to sophisticated processing circuitry. By rapidly analyzing the pattern and sequence of detector element excitation, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and economical production of the detector array and accompanying circuitry.

A contemporary subarray of detectors may, for example, contain 256 detectors on a side, or a total of 65,536 detectors, the size of each square detector being approximately 0.0035 inches on a side, with 0.0005 inches spacing between detectors. The total width of such a subarray would therefore be 1.024 inches on a side. Thus, interconnection of such a subarray to processing circuitry requires a connective module with sufficient circuitry to connect each of the 65,536 detectors to processing circuitry within a square a little more than one inch on a side. The subarrays may, in turn, be joined to form an array that includes 25 million detectors or more. Considerable difficulties are presented in aligning the detector elements with conductors on the connecting module and in isolating adjacent conductors in such a dense environment.

Because of their small size and brittle nature, subarrays of detectors are typically mounted upon a substrate so as to facilitate their handling and attachment to multi-layer ceramic modules, which typically contain filter, amplification, and multiplexing circuitry.

one example of a detector interface device or substrate for attaching infrared detectors to multi-layer modules is disclosed in U.S. Pat. No. 4,792,672 issued to SCHMITZ on Dec. 20, 1988 and entitled DETECTOR BUFFER BOARD, the contents of which are hereby incorporated by reference.

The SCHMITZ buffer board does not utilize wings or tabs which serve as handles for facilitating handling and alignment of the substrate with the multi-layer modules. Such tabs, according to the present invention, are preferably configured to have snap-off notches such that the tabs may be broken away from that portion of the substrate upon which the infrared detectors are mounted as discussed in detail below. Thus, the tabs may be utilized to facilitate attachment of the detector interface device, including the infrared detectors attached thereto, to a multi-layer module. The tabs are subsequently removed to facilitate the assembly of a number of such multi-layer modules into a detector array.

Difficulties have been encountered in providing a means for testing the functionality and reliability of individual detector elements after they have been attached to the substrate, as well as after attachment of the substrate to a multi-layer module. After mounting of the individual detector elements to the substrate, electrical testing of the detector elements is hampered by the small size of the electrical contacts formed upon contemporary substrates, which makes probing difficult.

Furthermore, after mounting the substrate to the multi-layer module, faults which occur therein may only be detected via electrical testing through the circuitry of the multi-layer module, thus substantially limiting the type of testing which may be performed and also substantially increasing the complexity of such testing.

Indeed, it is difficult to troubleshoot problems which are found during such testing. For example, an indication of a high resistance connection between an individual infrared detector and its associated circuitry within the multi-layer module cannot easily be isolated to a particular electrical interconnection via such testing. It is not possible to determine whether the high resistance connection is at the interface of the substrate and the detector elements or, conversely, if at the interface of the substrate and the multi-layer module. Thus, electrical testing performed subsequent to attachment of the substrate to the multi-layer module tends to provide test results which are ambiguous and of only limited help in fault isolation.

As such, it is beneficial to provide a means for testing individual infrared detectors both prior to and after interconnection with the multi-layer module wherein accurate troubleshooting of the individual infrared detector elements, as well as their associated electrical interconnections, is similarly facilitated.

Handling and mounting of the infrared detector elements to a multi-layer module, even after attachment of the detector interface device or substrate thereto, is difficult. Handling of the infrared detector elements is difficult both due to the small size and delicate nature thereof. It is extremely difficult to grasp the infrared detector elements, even when mounted upon the substrate, in a manner which is both secure and which is not likely to cause damage thereto.

As such, it is additionally beneficial to provide a means for handling infrared detector elements and attaching the infrared elements to multi-layer modules in a manner which is reliable and which is not likely to cause damage thereto.

SUMMARY OF THE INVENTION

The present invention specifically addresses and alleviates the above-mentioned deficiencies associated with the prior art. More particularly, the present invention comprises a substrate for attaching infrared detector elements to multi-layer modules, wherein the substrate comprises a detector interface member to which the infrared detector elements are attachable and which is attachable to the multi-layer module so as to provide electrical interconnection of the infrared detector elements and the multi-layer module. At least one removable tab is formed upon the detector interface member and a plurality of probing pads are formed upon each of the tabs. Conductive conduits formed upon the tabs extend from the detector interface member to the probing pads so as to facilitate electrical interconnection of dedicated ones of the infrared detector elements with dedicated ones of the probing pads. Electrical probing of the probing pads thus facilitates electrical testing, typically functional and/or resistance testing, of the individual detector elements and their electrical connections.

The tabs comprise break-away test tabs, preferably having a notch formed intermediate each tab and the detector interface member so as to facilitate breaking of the tabs away from the detector interface member. In the preferred embodiment of the present invention, two substantially planar tabs are formed as wings upon opposite sides of the detector interface member.

The detector interface member preferably comprises bump contacts formed thereon so as to facilitate electrical interconnection between the infrared detector elements and the multi-layer module. The detector interface member preferably comprises vias formed therethrough so as to facilitate electrical interconnection between the infrared detector elements and the multi-layer module. Those skilled in the art will recognize that various other means for providing such electrical interconnection are likewise suitable.

The probing pads may optionally be formed upon both sides of the tabs so as to reduce the density thereof and facilitate forming of probing pads of a larger size so as to even further enhance the probing process by reducing the accuracy required therein.

The number of pads preferably corresponds to the number of detector elements, each pad being connected to a dedicated detector element. Alternatively, each probing pad is connected to a plurality of individual detector elements so as to facilitate batch testing thereof.

Thus, in use, a plurality of infrared detector elements is attached to a detector interface member of a infrared detector substrate of the present invention. The infrared detector substrate of the present invention has at least one tab formed as a portion thereof. Conductive conduits electrically interconnect probing pads formed upon the tabs with corresponding dedicated infrared detector elements.

The substrate is next attached to a multi-layer module. After electrical testing or probing, the tabs are then removed from the detector interface member. Thus, the tabs are used for handling and alignment of the substrate to the multi-layer module, as well as electrical testing of the infrared detector elements and their electrical interconnections.

The probing pads are preferably electrically probed subsequent to attaching the infrared detector elements to the substrate and prior to attaching the substrate to the multi-layer module so as to provide an indication of the viability of the electrical interconnection resulting from such attachment. Optionally, the probing pads are electrically probed subsequent to attaching the substrate to the multi-layer module so as to facilitate testing of the electrical interconnection of the substrate to the multi-layer module. Attachment of the infrared detector elements to the substrate and attachment of the substrate to the multi-layer module preferably comprises bump bonding.

The infrared detector elements are preferably attached to the substrate as an array of infrared detector elements to facilitate such attachment. Alternatively, individual infrared detector elements or groups thereof may be individually attached to the substrate.

The tabs are removed from the substrate by manually bending the tabs so as to cause them to break away from the detector interface member along notches formed in the substrate intermediate the tabs and the detector interface member.

Thus, detectors are attached to the infrared detector substrate of the present invention first, i.e., prior to attachment to the multi-layer module. The detectors are then electronically tested by probing the probe pads formed upon the tabs. The tabs facilitate fan-out of the probe pads such that an increased surface area of the pads is facilitated. This increased surface area reduces the accuracy with which probing must be performed, thereby better facilitating reliable probing.

After probing, the tabs are used for handling, transfer, and alignment purposes to facilitate attachment of the detector array to a multi-layer module. After attachment of the detector array to a multi-layer module, the probing or electrical test may be repeated, again utilizing the probing pads upon the tabs so as to troubleshoot or confirm detector element performance. Upon completion of all such probing operations, the tabs are broken away from the attached detector module.

These, as well as other, advantages of the present invention will be more apparent from the following description and drawings. It is understood that changes in the specific structure shown and described may be made within the scope of the claims without departing from the spirit of the invention.

BRIEF DESCRIPTION OF THE DRAWINGS

FIG. 6 is an exploded perspective view illustrating attachment of an infrared detector array to a substrate having breakaway tabs according to the present invention;

FIG. 7 is an end view of a detector test fixture wherein the substrate is electrically probed so as to test the infrared detector elements and the electrical interconnection between the infrared detector elements and the substrate;

FIG. 8 is a perspective view illustrating attachment of the substrate to a multi-layer module, the substrate having an infrared detector array attached thereto;

FIG. 9 is an enlarged perspective view of the detector interface device of the substrate showing the notches for facilitating detachment of the tabs thereof;

DETAILED DESCRIPTION OF THE PREFERRED EMBODIMENT

The detailed description set forth below in connection with the appended drawings is intended as a detailed description of the presently preferred embodiments of the present invention, and is not intended to represent the only forms in which the present invention may be constructed or utilized. The description sets forth the functions and sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

Figure 1:
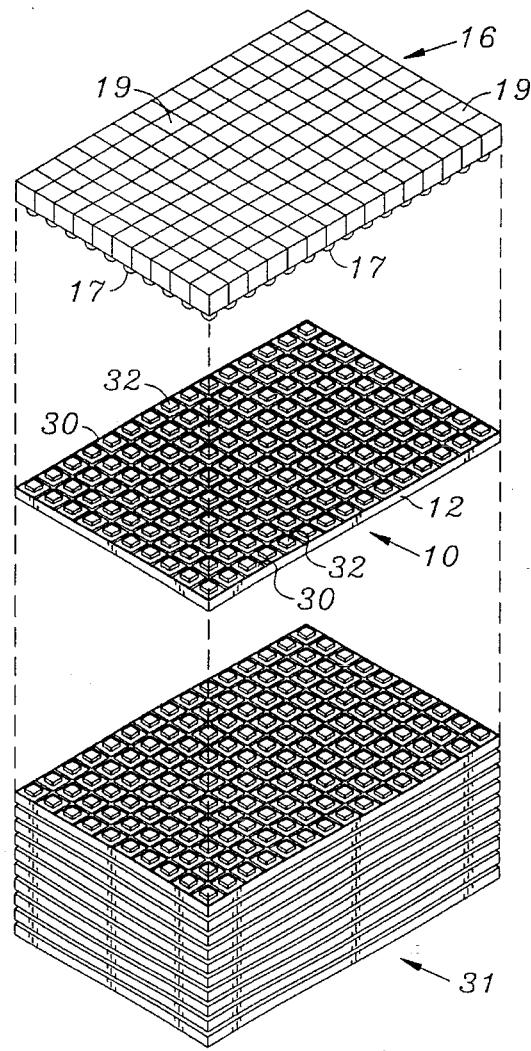
FIG. 1 is an exploded perspective view of an infrared detector array, prior art substrate, and a multi-layer module.
Figure 2:
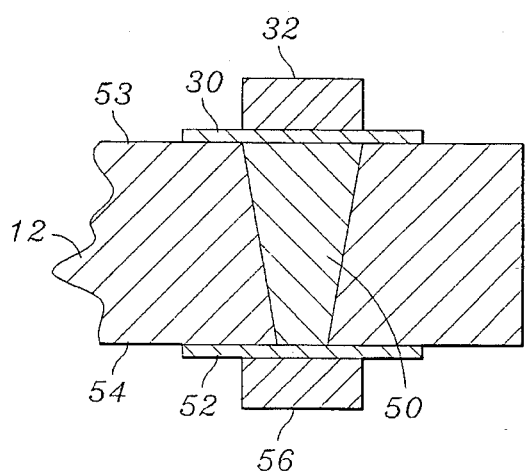
FIG. 2 is a cross-sectional side view of an individual via and its associated bump contacts of the substrate of FIG. 1.
Figure 14:
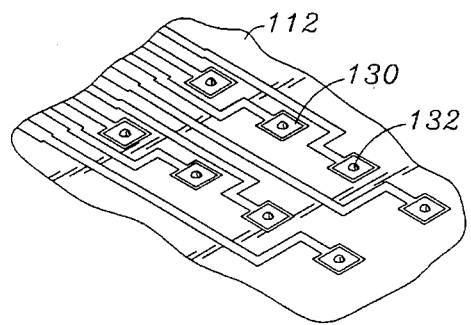
FIG. 14 is a fragmentary perspective view of the bump contacts formed upon the front surfaces of the substrate of FIG. 13 for electrically interconnecting the substrate and the infrared detector elements.
Figure 3:
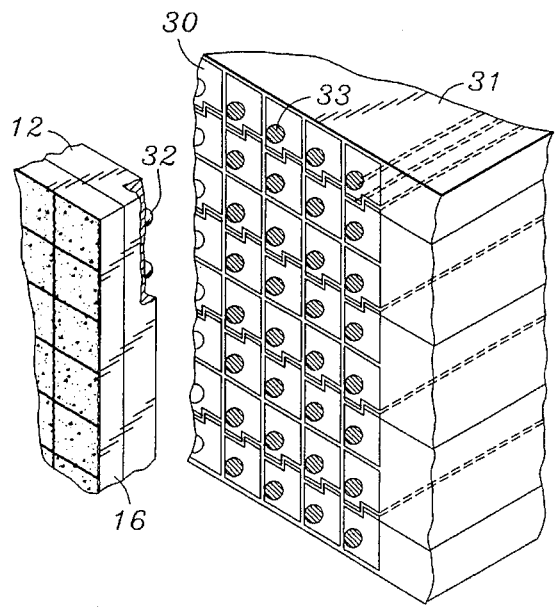
FIG. 3 is a perspective view of an infrared detector array attached to a prior art substrate, showing the substrate positioned for attachment to a multi-layer module.
Figure 16:
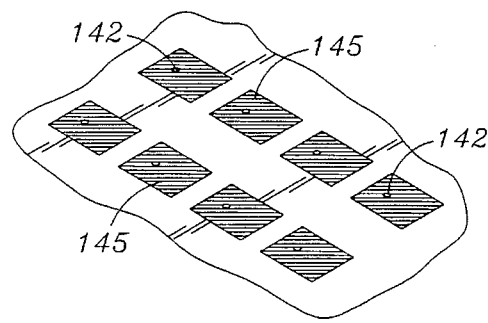
FIG. 16 is a fragmentary perspective view of the probing pads formed upon the rear side of breakaway tabs of the infrared detector substrate of FIG. 13 so as to facilitate probing from either side of the tabs.
Figure 15:
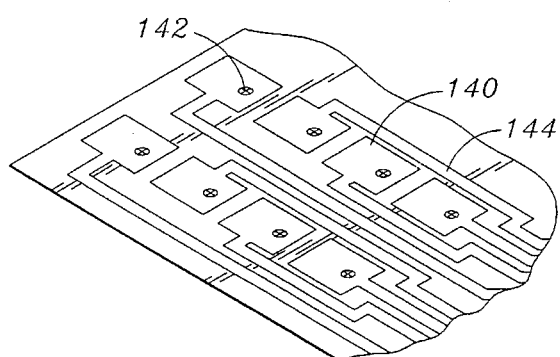
FIG. 15 is a fragmentary perspective view of the lead feed throughs for the probing pads of FIG. 16.
Figure 13:
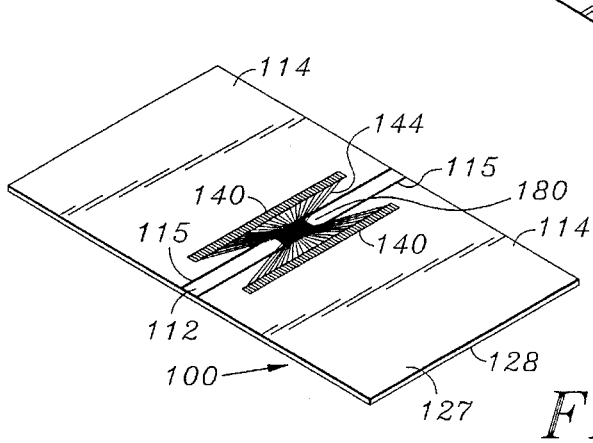
FIG. 13 is a perspective view of a second embodiment of the substrate of the present invention wherein the conductive conduits fan out to the test pads.
Figure 4:
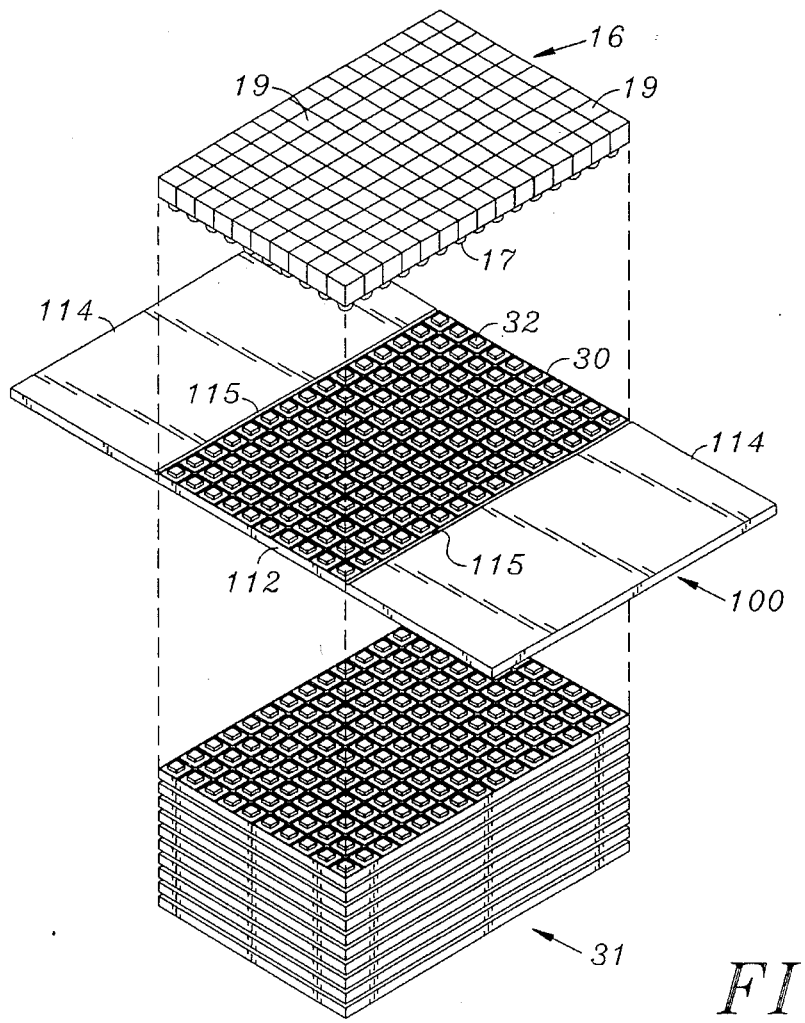
FIG. 4 is an exploded perspective view of an infrared detector array, a first embodiment of the substrate with breakaway tabs of the present invention, and a multi-layer module.

The infrared detector substrate of the present invention is illustrated in FIGS. 4–16 which depict two presently preferred embodiments of the invention. FIGS. 4–12 show a first embodiment of the present invention wherein conductive conduits extend parallel to one another from the detector interface member to pads formed upon the breakaway tabs. FIGS. 13–16 show a second embodiment of the present invention wherein conductive conduits extend from the detector interface member to pads formed upon the breakaway tabs in a generally radial or fan-like manner. FIGS. 1–3 show a prior art substrate and depict its mounting to a multi-layer module.

Referring now to FIGS. 1–3, the prior art substrate 10 comprises a detector interface member 12. Square contact pads 30 are formed upon the upper surface of the detector interface member 12 and contact bumps 32 are formed upon each contact pad 30. The contact bumps 32 facilitate electrical connection to infrared detector array 16.

With particular reference to FIG. 2, a metal-filled via 50 is formed through the detector interface member 12 to a corresponding conductive contact pad 52 formed upon the lower surface 54 of the detector interface member 10. A contact bump 56 is formed upon contact pad 52. Thus, electrical communication between the upper 53 and lower 54 surfaces of the detector interface member 12 is facilitated.

An infrared detector array 16 is attached to the detector interface member 12 via conductive bumps 17 formed upon the lower surface thereof. Each conductive bump 17 provides electrical conduction to a corresponding infrared detector element 19 formed upon the upper surface of the infrared detector array 16.

The detector interface member 12 attaches to a multi-layer module 31 via contact bumps 56 formed upon the lower surface 54 of the detector interface member 12 which attach to corresponding bumps 33 formed upon the multi-layer module 31.

With particular reference to FIG. 3, contact pads 30 having bumps, preferable indium bumps 32 formed thereupon, are formed upon the rear surface of the detector interface member 12. Corresponding bumps 33 are preferably formed upon the attachment surface of the multi-layer module 31. Similarly, contact pads and bumps are formed upon the rear surface of the infrared detector element array 16 and the front surface of the detector interface member 12 so as to facilitate electrical interconnection thereof.

Assembly of a plurality of multi-layer modules into an array thereof is described in detail in U.S. Pat. No. 4,659,931, issued to SCHMITZ, ET AL. on Apr. 21, 1987 and entitled HIGH DENSITY MULTI-LAYERED INTEGRATED CIRCUIT PACKAGE, the contents of which are hereby incorporated by reference.

As will be appreciated by those skilled in the art, handling and attachment of the detector interface member 12, having the infrared detector array 16 attached thereto, to the multi-layer module 31 is a difficult task. It is extremely difficult to securely and reliably hold the detector interface member 12 and manipulate so as to facilitate such attachment. As those skilled in the art will further appreciate, electrical testing of the infrared detector elements is difficult and limited in scope after their attachment to the detector interface member 10 and yet even more difficult after attachment of the detector interface member 12 to the multi-layer module 31.

In an alternative configuration of the present invention (not shown), the conductive conduits and conductive pads are formed upon the upper surface 153 of the substrate 100.

Referring now to FIGS. 4–12, a first embodiment of the infrared detector substrate with breakaway tabs 100 is illustrated. Two tabs 114 are formed on the detector interface member 112 and configured to easily breakaway therefrom. An infrared detector element array 16 is positioned for attachment to the detector interface member 112.

Grooves 115 are formed intermediate each breakaway tab 114 and the detector interface member 112, thereby defining the breakaway tabs 114 and facilitating easy breaking away thereof.

Figure 5:
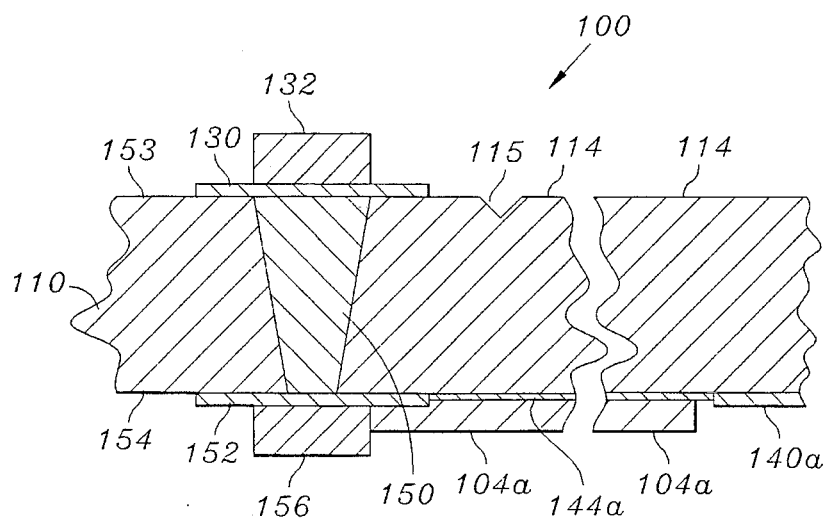
FIG. 5 is a cross-sectional side view of a via of the substrate of FIG. 4, showing its associated bump contacts, a conductive conduit interconnecting the lower-most bump contact thereof to a probing pad, and a notch formed therein so as to define breakaway tabs thereof.

With particular reference to FIG. 5, as in prior art detector interface members, metal-filled vias 150 provide electrical conduction through the detector interface member 110 from the upper surface 112 to the lower surface 154 thereof. Conductive pads 152 are formed upon the lower surface 154 of the detector interface member 110 and conductive bumps 156 are formed upon the conductive pads 152. In a preferred configuration of the first embodiment of the present invention, conductive conduits 144a are formed upon the lowermost surface 154 of the detector interface member 112 and breakaway tabs 114 and extend across the breakaway tabs 114 to probing pads 140. Insulator 164a preferably covers conductive conduits 144a. The probing pads 140a are considerably larger than the contact pads 152, so as to facilitate electrical testing by probing thereof. Additionally, such probing pads 140a facilitate electrical testing of the infrared detector array 16 and the detector interface member 112 after attachment thereof to a multi-layer module 31. Upon the completion of such testing, the breakaway tabs 114 may be snapped or broken off from the detector interface member 112 to facilitate the assembly of a plurality of multi-layer modules into an infrared detector subarray.

Figure 10:
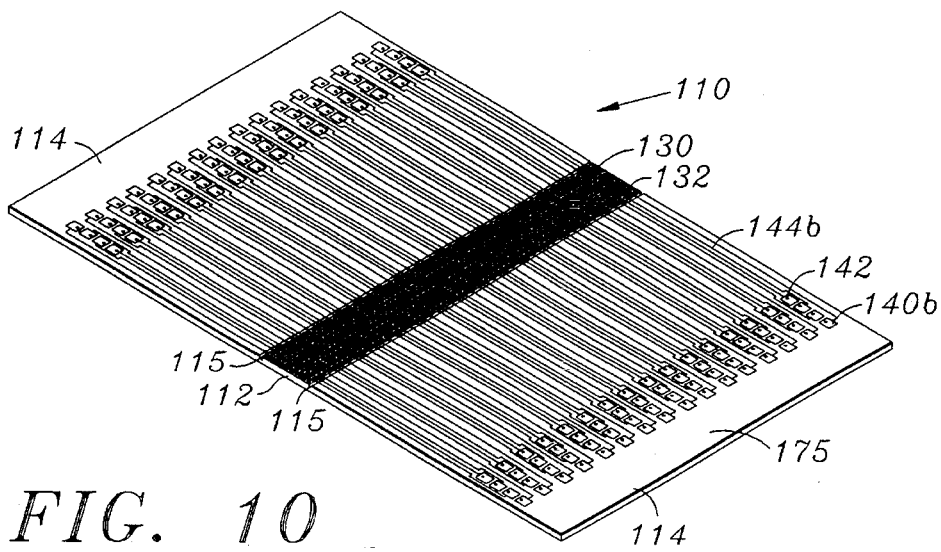
FIG. 10 is an enlarged perspective view of the substrate of FIG. 6 showing parallel conductive conduits extending from the detector interface member to the probing pads formed upon the tabs.
Figure 11:
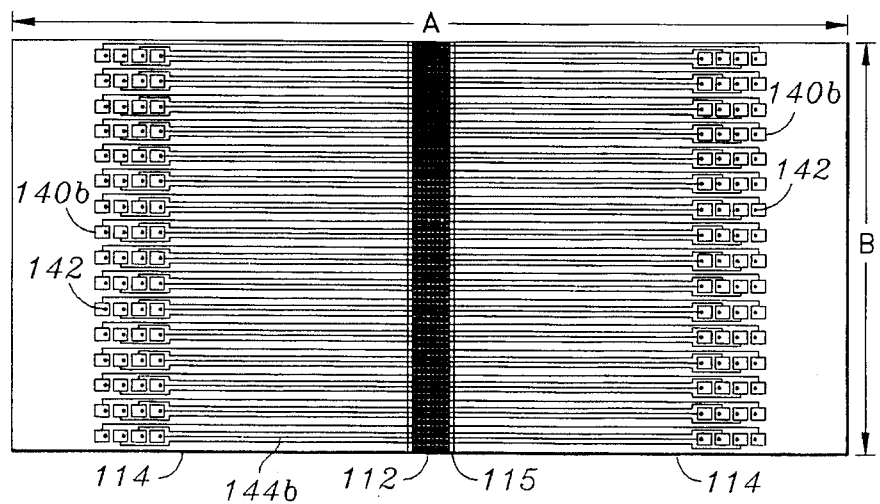
FIG. 11 is a top plan view of the infrared detector substrate of FIG. 10.
Figure 12:
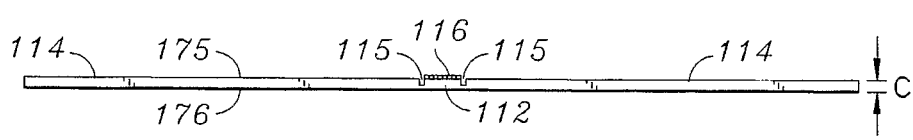
FIG. 12 is a side view of the infrared detector substrate of FIG. 11.

With particular reference to FIGS. 10–12, an alternative or second configuration of the first embodiment of the present invention is illustrated. In the second configuration, conductive conduits 144b and contact pads 140b are formed upon the upper surface 175 of the substrate 110. Those skilled in the art will recognize that the conductive conduits 144a or 144b and contact pads 140a or 140b may be formed upon either the upper surface 175 or lower surface 176 of the substrate 110, as desired. Indeed, various combinations of conductive conduits 144a and 144b and pads 140a and 140b may be formed upon the upper 175 and lower 176 surfaces, as desired.

With particular reference to FIG. 7, testing or probing of the infrared detector elements 16 attached to the detector interface member 12 is performed via a test fixture 20 which comprises a base 22 upon which the detector interface device 10 rests and a probe assembly 24 having probe tips 26 extending down to the rear surface 28 so as to facilitate electrical testing of the individual infrared detector elements of the infrared detector element array 16, as well as the electrical interconnection thereof to the detector interface member 12.

In the prior art, such testing can only be performed prior to attachment of the detector interface member 12 to the multi-layer module 31, since the rear surface of the detector interface member is not available for such probing after interconnection to the multi-layer module. Furthermore, such electrical testing or probing of the rear surface of the detector interface member 12 inherently requires precise positioning of the probe tips 26, due to the extremely small size of the contact pads formed upon the rear surface 28 of the detector interface member.

Referring now to FIG. 8, upon completion of such probing, the detector interface member 12 is aligned with and attached to the multi-layer module 31. After attachment of the detector interface member 12 to the multi-layer module 31, the tabs 14 of the substrate 10 are broken away from the detector interface member 12.

Referring now to FIGS. 13–16, a second embodiment of the infrared detector substrate 100 of the present invention generally comprises a detector interface member 112 having wings or tabs 114 formed upon the detector interface member 112 and has notches 115 formed at the junction of the tabs 114 and the detector interface member 112 to facilitate separation thereof, as in the prior art. The present invention further comprises a plurality of contact pads 130 formed upon the detector interface member 112 for facilitating electrical communication between the detector interface member 112 and an infrared detector element array. Indium bump contacts 132 are formed upon each contact pad 130.

Traces or conductive conduits 144 electrically interconnect the feed through pads 140 with the contact pads 130 so as to facilitate automated electrical probing of the detector interface module 112 and its attached infrared detector element array. Vias or feed throughs 142 electronically interconnect each conduit 144 with a dedicated probing pad 145 formed upon the opposite surface of the detector interface member 112. The probing pads 145 are much larger and spaced much further apart than the corresponding contact pads 130, such that the probing pads 140 are much easier to probe and such that they readily facilitate automated electronic testing therewith.

Optionally, the probing pads 145 may be formed upon the front surface 127 of the tabs 114 rather than the rear surface 128 thereof. Alternatively, the probing pads 145 may be formed upon both the front 127 and rear 128 surfaces of the tabs 114.

In the second embodiment of the present invention, the array of contact bumps for providing electrical conductivity to an infrared detector array is formed so as to have a much smaller footprint than in the first embodiment of the present invention. Thus, the conductive conduits (144) extending therefrom to conductive test pads (140) must fan out, as opposed to having a parallel configuration as in the first embodiment of the present invention.

With particular reference to FIGS. 11 and 12, in the preferred embodiments of the present invention, the length A of the detector interface device is approximately 0.532 in., the width B is approximately 0.256 in., and the thickness C is approximately 0.007 in. The detector interface device is preferably configured to accommodate an 8x256 array of infrared detector elements. Those skilled in the art will recognize that various other dimensional configurations may be utilized to provide attachment of various other array configurations, 128x128 for example, of infrared detector elements, as desired.

Having thus described the structure of the infrared detector substrate of the present invention, a brief description of its use may be beneficial. To mount an infrared detector element array upon a multi-layer module, a substrate 110 is used to facilitate handling and alignment of the infrared detector element array. The infrared detector element array is first attached and electrically interconnected to the detector interface member 112 of the infrared detector substrate 110 via bump bonding or a similar process. Those skilled in the art will recognize that various such methods of attachment and electrical interconnection are likewise suitable.

After attachment and electrical interconnection of the infrared detector element array 116 to the detector interface member 112 electrical testing, i.e., probing, may be performed. The detector interface member 112 is then aligned with the multi-layer module such that contact pads and/or bumps upon both the detector interface member 112 and the multi-layer module 31 align. The detector interface module 112 is then attached to and electrically interconnected with the multi-layer module 31, typically in a manner similar to attachment and electrical interconnection of the infrared detector element array with the detector interface member 112. After such attachment and electrical interconnection of the detector interface member with the multi-layer module electrical testing, i.e., probing may again be performed. The tabs 114 of the infrared detector substrate 110 are then snapped off or broken away from the detector interface member 112 so as to facilitate the formation of an array of such assembled multi-layer modules or submodules into an infrared detector array, as discussed above.

Thus, both after the infrared detector element array 116 has been attached to and electrically interconnected with the detector interface member 112, and prior to attachment and electrical interconnection of the detector interface member 112 with the multi-layer module, electrical testing or probing of the infrared detector substrate 110 may be performed. Such probing tests both the infrared detector elements, as well as the electrical connection thereof with the detector interface member 112. Such testing is performed by contacting electrical probe tips with the probing pads 142 formed upon the tabs 114. Such electrical testing may optionally be automated. The larger size of the probing pads 145 as compared to the contact pads 30 makes the probing process much easier by reducing the accuracy with which probing must be performed. Thus, the ease with which such testing may be automated is enhanced.

It is understood that the exemplary infrared detector substrate described herein and shown in the drawings represents only a presently preferred embodiment of the invention. Indeed, various modifications and additions may be made to such embodiment without departing from the spirit and scope of the invention. For example, various shapes and configurations of the infrared detector substrate are contemplated. For example, the infrared detector substrate may alternatively be triangular, rectangular, hexagonal, or of various other shapes. Also, various means for interconnecting the infrared element detector array and the detector interface member, as well as for interconnecting the detector interface member and the multi-layer module, are contemplated. Those skilled in the art will recognize that such means of attaching and interconnecting such components are likewise suitable. Thus, these and other modifications and additions may be obvious to those skilled in the art and may be implemented to adapt the present invention for use in a variety of different applications.

What is claimed is:

1. A substrate for attaching infrared detector elements to a multi-layer module, the substrate comprising:

a) a detector interface member to which the infrared detector elements are attachable and which is attachable to the multi-layer module so as to provide electrical communication between the infrared detector elements and the multi-layer module; and b) at least one removable tab formed upon said detector interface member to facilitate handling thereof.

2. The substrate as recited in claim 1 further comprising:

a) a plurality of probing pads formed upon said tab(s); and b) conductive conduits formed upon said tab(s) and extending from said detector interface member to said probing pads so as to facilitate electrical communication between dedicated ones of said infrared detector elements and dedicated ones of said probing pads;

c) wherein said probing pads facilitate electrical testing of individual infrared detector elements.

3. The substrate as recited in claim 1 further comprising a notch formed so as to facilitate breaking of the tab(s) away from the detector interface member.

4. The substrate as recited in claim 1 wherein said tab(s) comprise two tabs formed upon opposite sides of said detector interface member.

5. The substrate as recited in claim 1 wherein said tab(s) comprise substantially planar tab(s).

6. The substrate recited in claim 1 wherein said detector interface member comprises bump contacts formed thereon so as to facilitate electrical communication between the infrared detector elements and the multi-layer module.

7. The substrate as recited in claim 1 wherein said detector interface member comprises vias formed therethrough so as to facilitate electrical interconnection between the infrared detector elements and the multi-layer module.

8. The substrate as recited in claim 1 wherein said probing pads are formed upon two sides of said tab(s).

9. The substrate as recited in claim 1 wherein the number of probing pads corresponds to the number of detector elements.

10. An infrared detector subassembly comprising:

a) a plurality of infrared detector elements configured in an array;

b) a multi-layer module containing circuitry for processing signals from said infrared detector elements;

c) a substrate attaching said infrared detector elements to said multi-layer modules, the substrate comprising:

i) a detector interface member to which the infrared detector elements are attached and which is attached to the multi-layer module so as to provide electrical communication between the infrared detector elements and the multi-layer module;

ii) at least one tab formed upon said detector interface member;

iii) a plurality of probing pads formed upon said tab(s); and iv) conductive conduits formed upon said tab(s) and extending from said detector interface member to said probing pads so as to facilitate electrical communication between dedicated ones of said infrared detector elements and dedicated ones of said probing pads; and d) wherein said probing pads facilitate electrical testing of individual infrared detector elements.

11. The infrared detector subassembly as recited in claim 10 wherein said tab(s) comprise breakaway tabs.

12. The infrared detector subassembly as recited in claim 10 further comprising a notch formed intermediate each tab and the detector interface member so as to facilitate breaking of the tab(s) away from the detector interface member.

13. The infrared detector subassembly as recited in claim 10 wherein said tab(s) comprise two tabs formed upon opposite sides of said detector interface member.

14. The infrared detector subassembly as recited in claim 10 wherein said tab(s) comprise substantially planar tab(s).

15. The infrared detector subassembly recited in claim 10 wherein said detector interface member comprises bump contacts formed thereon so as to facilitate electrical interconnection between the infrared detector elements and the multi-layer module.

16. The infrared detector subassembly as recited in claim 10 wherein said detector interface member comprises vias formed therethrough so as to facilitate electrical interconnection between the infrared detector elements and the multi-layer module.

17. The infrared detector subassembly as recited in claim 10 wherein said probing pads are formed upon two sides of said tab(s).

18. The infrared detector subassembly as recited in claim 10 wherein the number of probing pads corresponds to the number of detector elements.

19. A method for assembling infrared detector subarrays, said method comprising the steps of:

a) attaching a plurality of infrared detector elements to a detector interface member, the detector interface member having at least one tab formed thereon and also having conductive conduits formed upon the tab(s) such that the conductive conduits provide electrical communication between the infrared detector elements and probing pads formed upon said tab(s);

b) attaching the substrate to a multi-layer module; and c) removing the tab(s) from the detector interface member.

20. The method as recited in claim 19 further comprising the step of electrically probing the probing pads formed upon said tab(s) subsequent to attaching the infrared detector elements to the detector interface member and prior to attaching the substrate to the multi-layer module.

21. The method as recited in claim 19 further comprising the step of electrically probing the probing pads formed upon said tab(s) subsequent to attaching the detector interface member to the multi-layer module.

22. The method as recited in claim 19 wherein the step of attaching the infrared detector elements to the detector interface member comprises bump bonding the infrared detector elements thereto.

23. The method as recited in claim 19 wherein the step of attaching the detector interface member to the multi-layer module comprises bump bonding the detector interface member thereto.

24. The method as recited in claim 19 wherein the step of attaching a plurality of infrared detector elements to the detector interface member comprises attaching an array of infrared detector elements to the detector interface member.

25. The method as recited in claim 19 wherein the step of attaching the detector interface member to the multi-layer module comprises handling the detector interface member via the tab(s) formed thereon.

26. The method as recited in claim 19 wherein the step of removing the tab(s) from the detector interface member comprises breaking the tab(s) away from the detector interface member along notches formed intermediate the tab(s) and the detector interface member.

* * * * *